(12) United States Patent
Davis (10) Patent No.: US 6,454,514 B2
(45) Date of Patent: Sep. 24, 2002

(54) MICROELECTRONIC WORKPIECE SUPPORT AND APPARATUS USING THE SUPPORT

(75) Inventor: Jeffry A. Davis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/372,366

(22) Filed: Aug. 11, 1999

Related U.S. Application Data (63) Continuation-in-part of application No. 09/112,259, filed on Jul. 8, 1998.
(60) Provisional application No. 60/121,005, filed on Feb. 22, 1999.

(51) Int. Cl.[7] .................................................. B25J 15/08
(52) U.S. Cl. ..................... 414/749.1; 294/1.1; 294/87.1; 294/902
(58) Field of Search ........................... 414/749.1, 751.1, 414/752.1, 937, 938, 404, 281; 294/1.1, 902, 87.1; 206/711, 712, 713, 832, 833; 438/978; 901/15

(56) References Cited

U.S. PATENT DOCUMENTS

| | | | |
|---|---|---|---|
| 3,247,979 A | * 4/1966 | Melton et al. | ............ 901/15 X |
| 4,431,361 A | 2/1984 | Bayne | |
| 4,566,839 A | * 1/1986 | Butler | ......................... 414/404 |
| 4,568,234 A | 2/1986 | Lee et al. | |
| 4,619,575 A | * 10/1986 | Summa et al. | .......... 414/281 X |
| 4,724,963 A | 2/1988 | Mortensen | |
| 4,840,530 A | 6/1989 | Nguyen | |
| 4,886,412 A | 12/1989 | Wooding et al. | |
| 4,987,407 A | * 1/1991 | Lee | ........................ 414/404 X |
| 5,021,862 A | * 6/1991 | Ogino | .................... 438/978 X |
| 5,110,248 A | 5/1992 | Asano | |
| 5,125,784 A | 6/1992 | Asano | |
| 5,467,813 A | * 11/1995 | Vermaat | ................... 901/15 X |
| 5,620,295 A | 4/1997 | Nishi | |
| 5,664,337 A | * 9/1997 | Davis et al. | ............ 414/938 X |
| 5,678,320 A | 10/1997 | Thompson et al. | |
| 5,784,797 A | 7/1998 | Curtis et al. | |
| 6,273,110 B1 | 8/2001 | Davis et al. | |
| 6,279,724 B1 | 8/2001 | Davis | |

OTHER PUBLICATIONS

Centurium Robot End Effector Booklet, Rev. A—Sep. 13, 1995, 8 pages.

* cited by examiner

*Primary Examiner*—Donald W. Underwood
(74) *Attorney, Agent, or Firm*—Lyon & Lyon LLP (57) ABSTRACT

A workpiece support and an apparatus including such a workpiece support are set forth. The workpiece support includes a set of grooved members for supporting a series of workpieces. The workpieces may be similarly shaped, e.g. circular or rectangular, and similarly sized, each having a front face and a back face. An outer perimeter of each workpiece may be beveled at both faces, beveled at one face, unbeveled, convex, or concave. Each grooved member has a series of similar grooves. Being adapted to receive such a workpiece, each groove has a bearing wall and a wedging wall shaped and oriented so that a line normal to the wedging wall intersects but is not normal to the bearing wall. For many applications, two grooved members are employed, which are parallel to one another, spaced from one another, and oriented so that the grooves of the grooved members are generally aligned. To this end, a first grooved member is oriented so that the front faces of the received workpieces bear against the bearing walls of the grooves of the first grooved member and so that the received workpieces touch the wedging walls of the grooves of the first grooved member. A second grooved member is oriented so that the back faces of the received workpieces bear against the bearing walls of the grooves of the second grooved member and so that the received workpieces touch the wedging walls of the grooves of the second grooved member. Thus, the workpieces received by the grooves of the grooved members are wedged so as not to tip, shake, or wobble.

35 Claims, 10 Drawing Sheets

MICROELECTRONIC WORKPIECE SUPPORT AND APPARATUS USING THE SUPPORT

CROSS-REFERENCE TO RELATED APPLICATIONS

This Application is a continuation-in-part of U.S. application serial No. 09/112,259 filed on Jul. 8, 1998.

This application claims priority of U.S. application Ser. No. 60/121,005, filed Feb. 22, 1999, and entitled "Microelectronic Workpiece Support and Apparatus Using the Support".

STATEMENT REGARDING FEDERALLY SPONSORED RESEARCH OR DEVELOPMENT

Not Applicable

BACKGROUND OF THE INVENTION

The present invention pertains to a support for microelectronic workpieces, such as semiconductor wafers, compact recording discs, or other such workpieces. More particularly, the present invention relates to a support for microelectronic workpieces, and corresponding apparatus using the support, wherein the support assists in safely restricting movement of the workpieces thereby preventing or otherwise inhibiting tipping, shaking, or wobbling of the workpieces.

Microelectronic workpieces, such as semiconductor wafers and the like, undergo a substantial number of processes before ultimately forming a microelectronic component or circuit. During such processing, one or more of the workpieces must be supported, for example, as they are transferred to or from a processing station of a tool, as they are processed at the station, wall they are stored at various staging areas within the each tool as well as along the production line, as they are transferred between the various processing tools of the production line, etc.

One tool that is used for processing microelectronic workpieces is exemplified in U.S. Pat. No. 5,660,517 to Thompson et al. In the particular tool illustrated in the '517 patent, the workpieces are removed from wafer carriers (cassettes) by elevator heads, whereupon the workpieces are transferred from the elevator heads by transfer mechanisms, for processing at various processing stations within the tool. The disclosure of U.S. Pat. No. 5,660,517 is incorporated herein by reference.

The transfer mechanism illustrated in the '517 patent includes components that are now common to a number of widely used systems. More particularly, each transfer mechanism employs a microelectronic support that comprises two transfer arms, each transfer arm comprising a grooved strip for engaging the workpieces as the workpieces are lifted from the elevator heads and transferred to, for example, one or more of the workpiece processing stations of the tool. The grooved strips are initially deployed beneath and on opposite sides of the centers of the workpieces. Each strip has a series of grooves, each groove positioned to receive a respective workpiece. Usually, there are between thirteen and fifty-two grooves that are used to reflect current industry standards for wafer carriers.

In such known microelectronic supports, each groove is comprised solely of a pair of parallel walls, which provide clearances for the workpieces. As a result of the clearances, the workpieces can tip, shake, or wobble in the grooves, particularly during wafer transfer operations. Usually, such tipping, shaking, or wobbling is not problematic. However, under some conditions, tipping, shaking, or wobbling can result in damage to some of the workpieces and/or the generation of unwanted particles, which can be a source of contamination. The present invention has resulted from efforts to prevent or otherwise inhibit the workpieces from tipping, shaking, or wobbling in the grooves of such grooved members.

SUMMARY OF THE INVENTION

A workpiece support and an apparatus including such a workpiece support are set forth. The workpiece support includes a set of grooved members for supporting a series of workpieces. The workpieces may be similarly shaped, e.g. circular or rectangular, and similarly sized, each having a front face and a back face. An outer perimeter of each workpiece may be beveled at both faces, beveled at one face, unbeveled, convex, or concave.

Although the grooved members are particularly useful for supporting semiconductor wafers, compact recording discs, or other microelectronic workpieces, the grooved members prove to be additionally useful for supporting diverse workpieces. Although the grooved members are useful on the transfer arms of a transfer mechanism, as mentioned above, the grooved members prove to be additionally useful on an elevator head, as mentioned above, or in other diverse applications, such as those described below.

Each grooved member has a series of similar grooves. Being adapted to receive such a workpiece, each groove has a bearing wall and a wedging wall shaped and oriented so that a line normal to the wedging wall intersects but is not normal to the bearing wall. For many applications, two grooved members are employed, which are parallel to one another, spaced from one another, and oriented so that the grooves of the grooved members are generally aligned. To this end, a first grooved member is oriented so that the front faces of the received workpieces bear against the bearing walls of the grooves of the first grooved member and so that the received workpieces touch the wedging walls of the grooves of the first grooved member. A second grooved member is oriented so that the back faces of the received workpieces bear against the bearing walls of the grooves of the second grooved member and so that the received workpieces touch the wedging walls of the grooves of the second grooved member. Thus, the workpieces received by the grooves of the grooved members are wedged so as not to tip, shake, or wobble.

These and other objects, features, and advantages of this invention are evident from the following description of a preferred embodiment of this invention, with reference to the accompanying drawings.

DETAILED DESCRIPTION OF THE INVENTION

Figures 1, 2, 3:
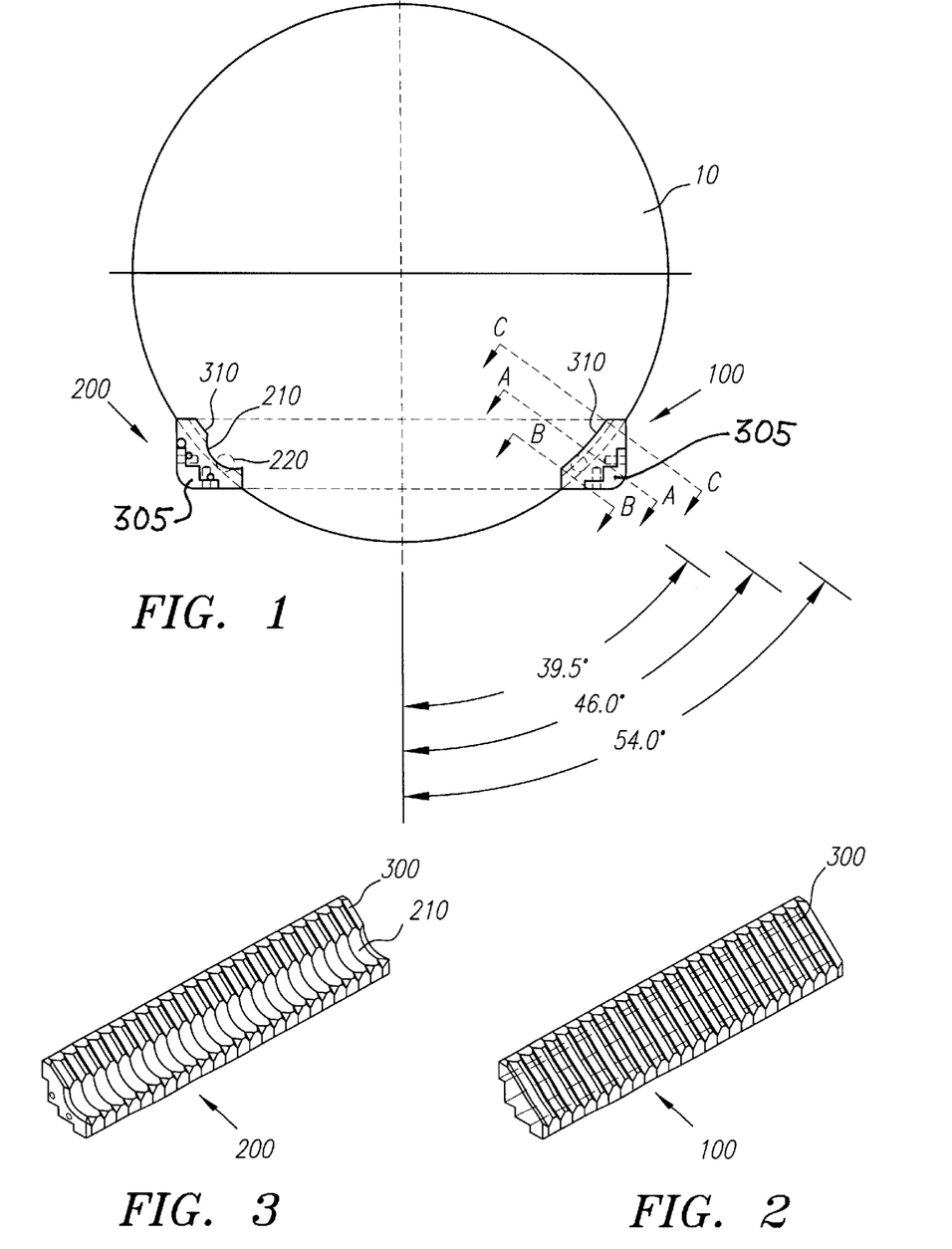
FIG. 1 is a simplified view of a set of two grooved members supporting a series of semiconductor wafers, an endmost one of which is shown, as seen from a back end of the set of grooved members.
FIG. 2 is an isometric view of a first grooved member of the set, as seen from an upper, back vantage.
FIG. 3 is an isometric view of a second grooved member of the set, as seen from an upper, front vantage.

With reference to FIG. 1, there is shown a microelectronic workpiece support constructed in accordance with one embodiment of the present invention. In accordance with the embodiment, the microelectronic workpiece support it is comprised of a first and second grooved members that are disposed opposite one another to engage different peripheral portions of one or more workpieces 10, such as semiconductor wafers, compact recording discs, or other microelectronic workpieces. As compared to previously known supports for similar uses, the grooved members 100, 200, are improved so as to prevent or otherwise inhibit the workpieces from tipping shaking, or wobbling.

Figure 4A:
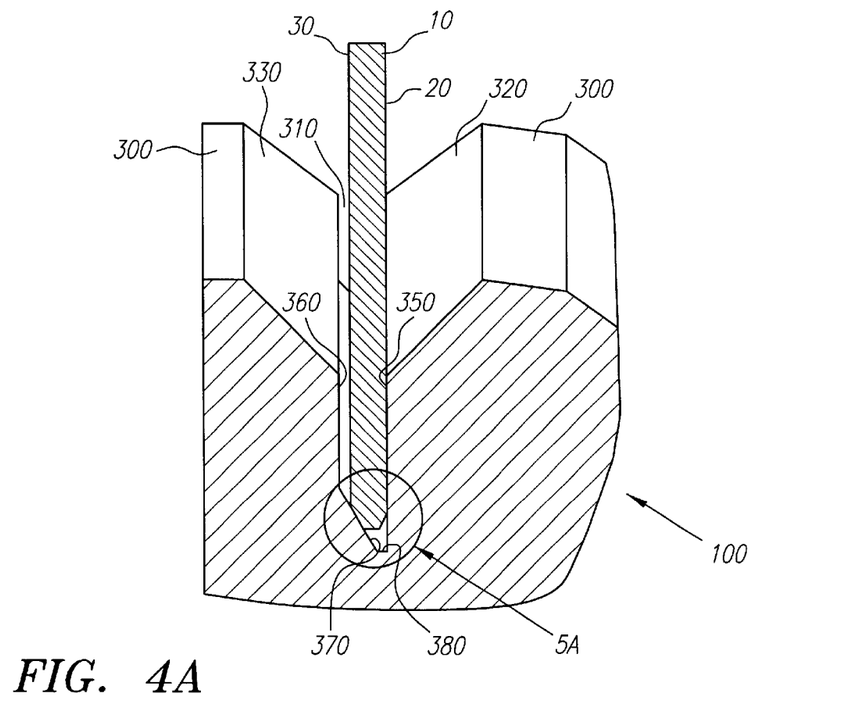
FIGS. 4A, 4B, and 4C are fragmentary, sectional views taken along lines A—A, B—B, and C—C respectively in FIG. 1, in directions indicated by arrows. The semiconductor wafer that is shown has one of several possible profiles at its outer perimeter.
Figure 4B:
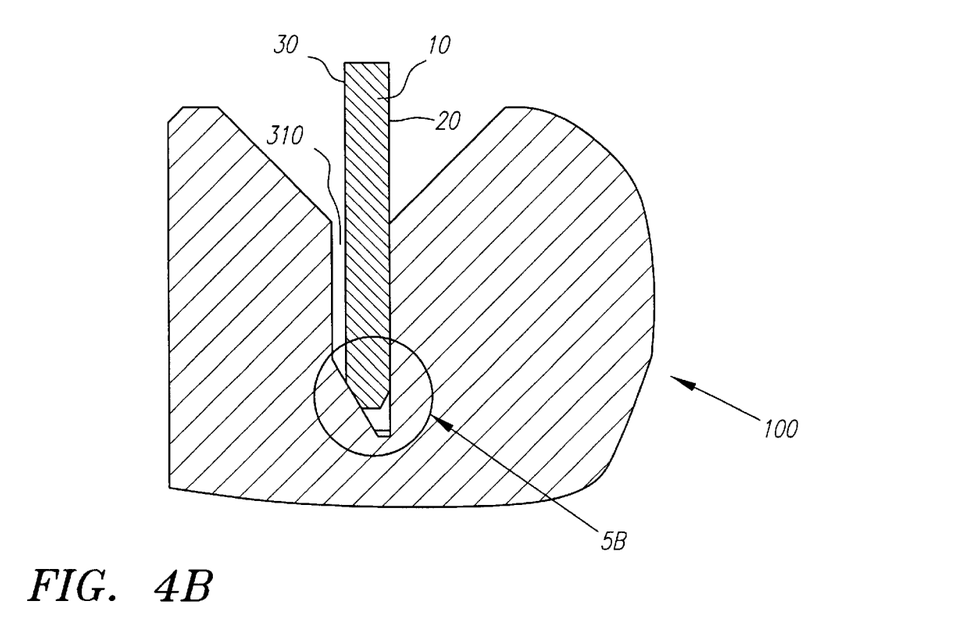
Figure 4C:
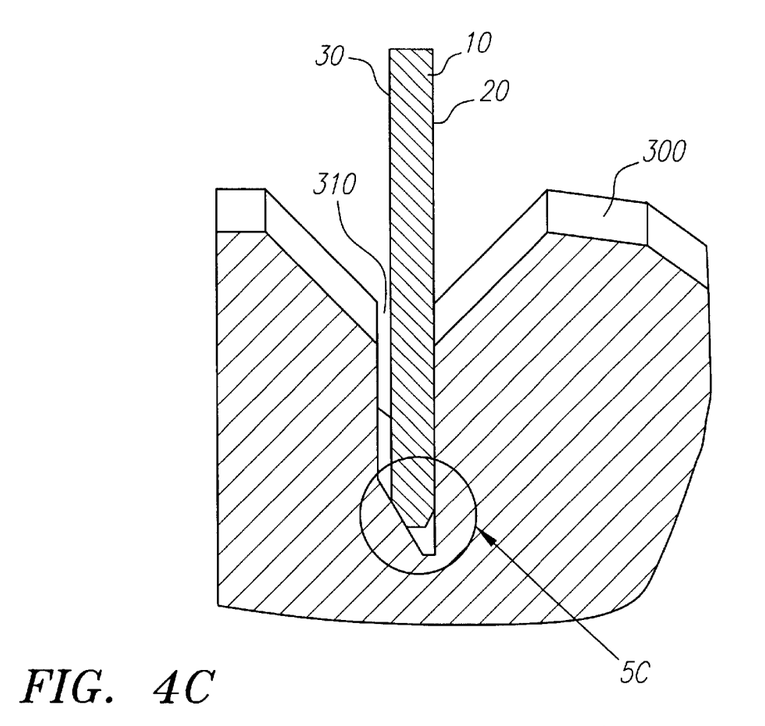
Figure 5A:
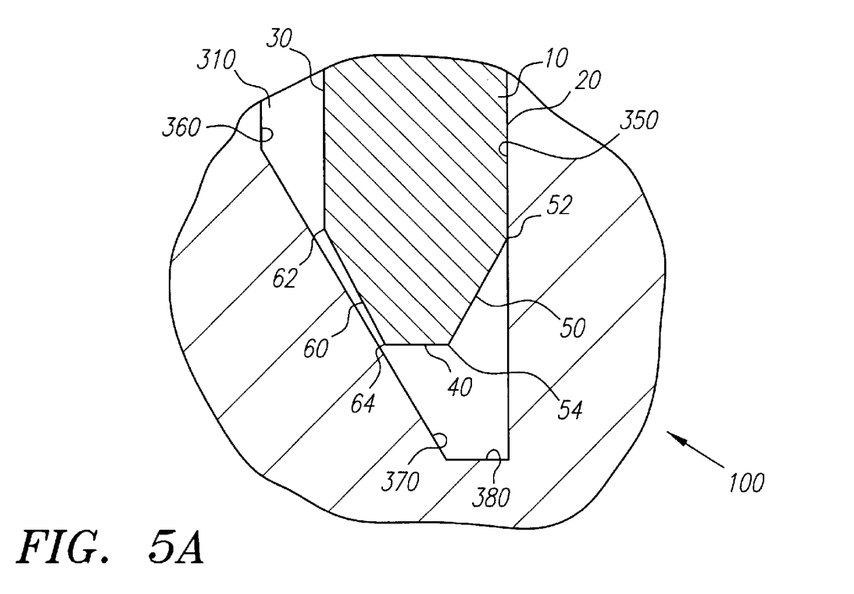
FIGS. 5A, 5B, and 5C are enlarged details of encircled regions in FIGS. 4A, 4B, and 4C respectively.
Figure 5B:
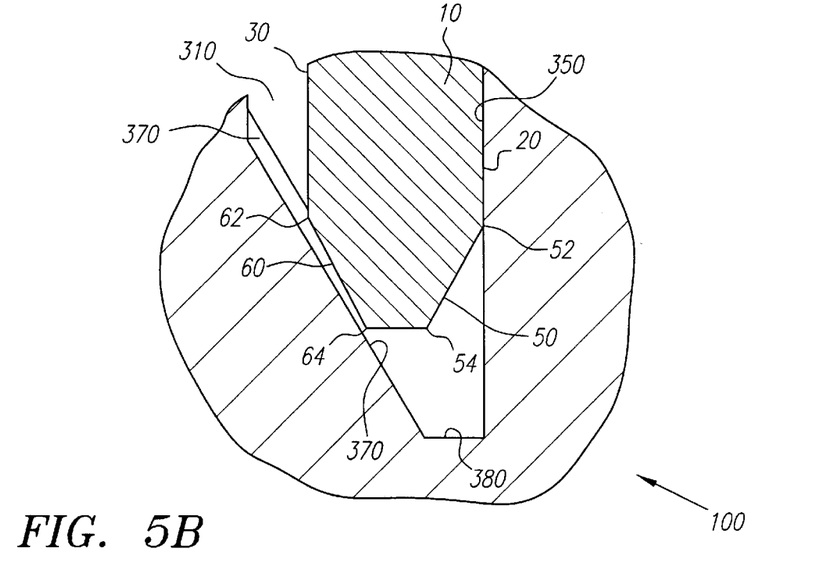
Figure 5C:
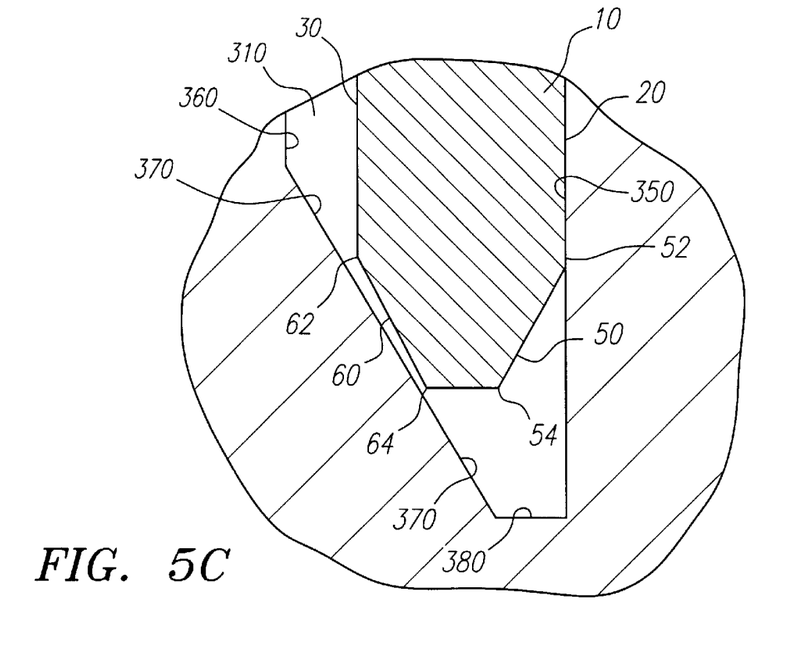
Figure 6A:
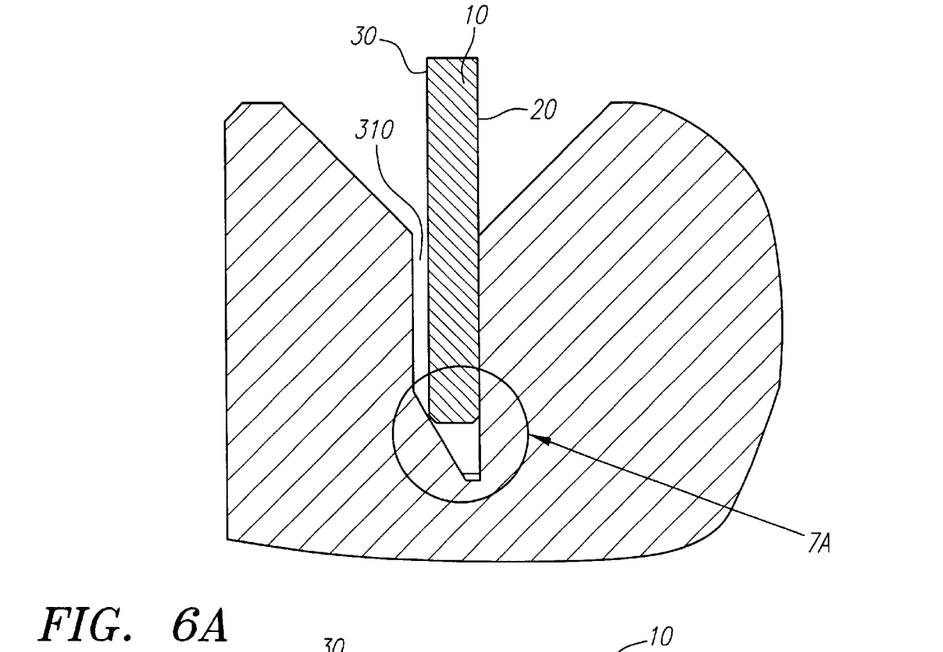
FIGS. 6A, 6B, and 6C are fragmentary, sectional views similar to FIGS. 4A, 4B, and 4C respectively, except that the semiconductor wafer that is shown has a different profile at its outer perimeter.
Figure 6B:
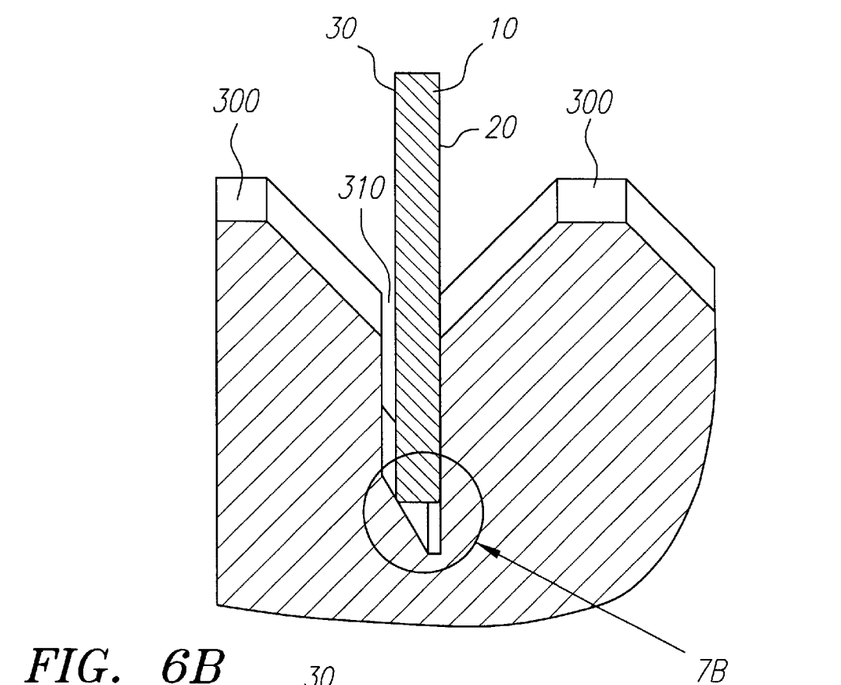
Figure 6C:
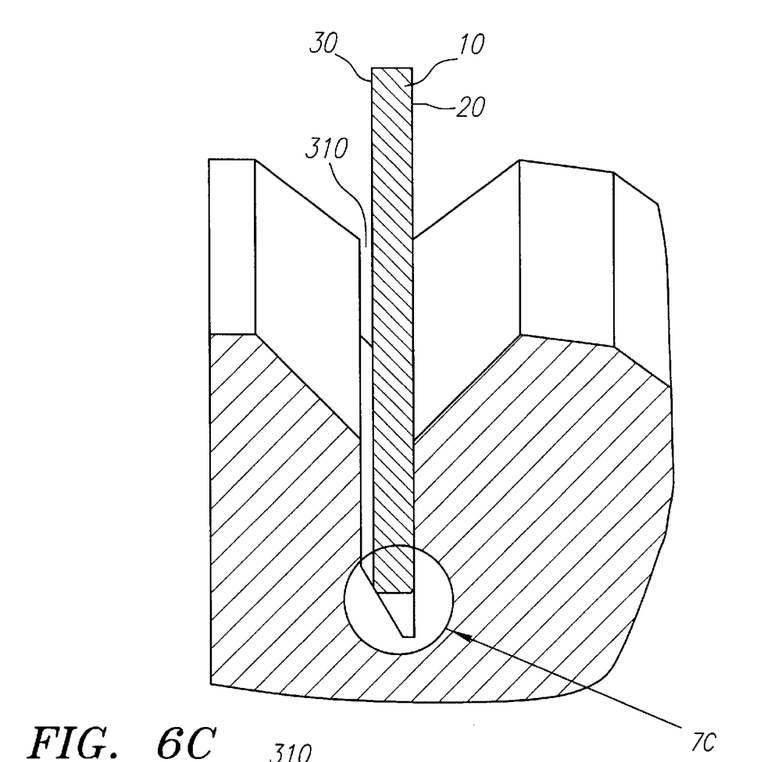
Figure 7A:
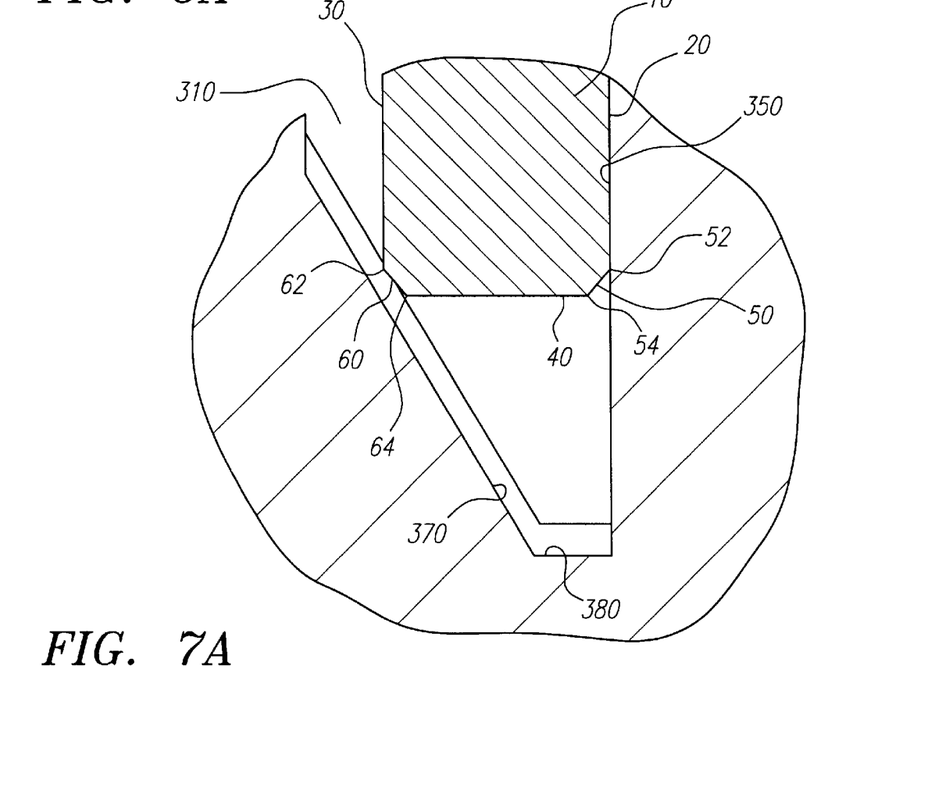
FIGS. 7A, 7B, and 7C are enlarged details of encircled regions in FIGS. 6A, 6B, and 6C respectively.
Figure 7B:
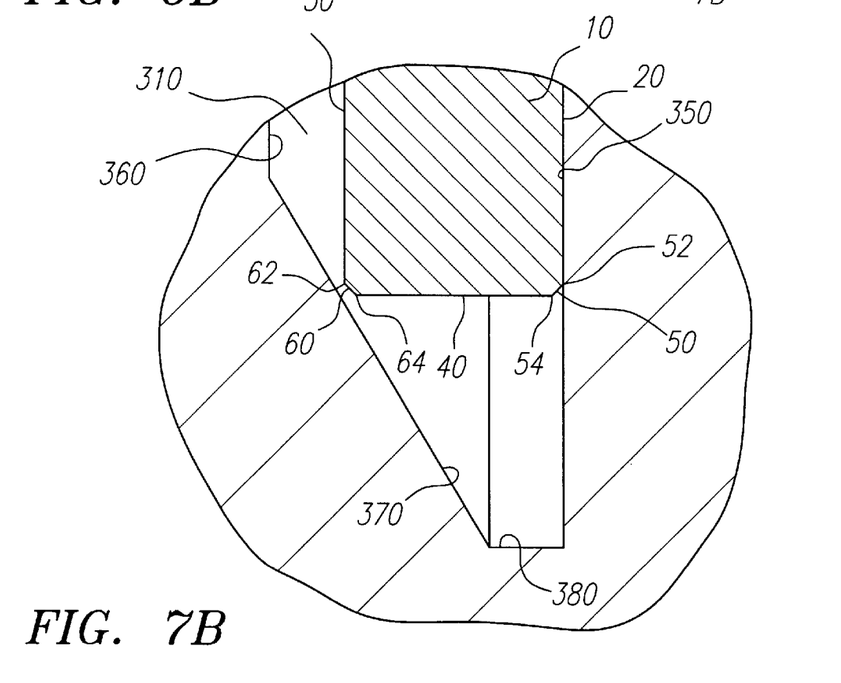
Figure 7C:
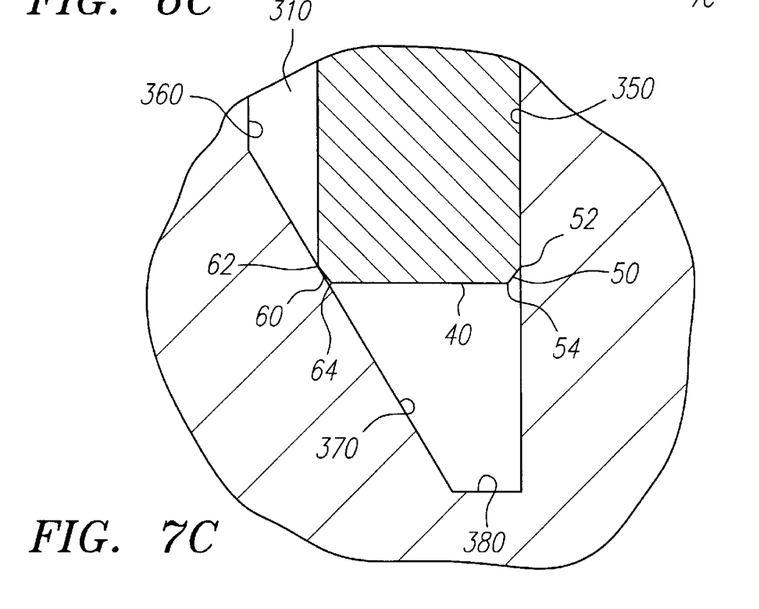

As shown in the particular embodiment illustrated in FIGS. 1, 4A, and 5A, the workpieces 10 are in the form of circular wafers, such as circular semiconductor wafers. Accordingly, each workpiece 10 has a front face 20, which is circular, a back face 30, which is circular, an outer perimeter 40, which is cylindrical and which defines a workpiece radius, a front bevel 50 meeting the front face 20, and a back bevel 60 meeting the back face 30. The front bevel 50 has an inner edge 52 where the front bevel 50 meets the front face 20 and an outer edge 54 where the front bevel 50 meets the outer perimeter 40. The back bevel 60 has an inner edge 62 where the back bevel 60 meets the back face 30 and an outer edge 64 where the back bevel 60 meets the outer perimeter 40. The bevels 50, 60, may be comparatively large, as shown in FIGS. 4A through 5C, or comparatively small, as shown in FIGS. 6A through 7C. The grooved members 100, 200, would be similarly useful if one or both of the bevels 50, 60, were omitted or if the outer perimeter 40 were to have a different profile, e.g. a convex or concave profile. As such, the grooved members 100, 200 are suitable for support of a wide range of microelectronic workpiece types.

The grooved members 100, 200, are similar except that, as seen in FIGS. 1 and 3, the teeth 300 of the second grooved member 200 have recesses 210 to accommodate a workpiece sensor 220, which is shown in broken lines. Otherwise, the grooved members 100, 200 are similar except for mounting holes and other minor details.

Each of the grooved members 100, 200 has a series of teeth 300 defining a series of similar, upwardly open grooves 310. Each groove 310 has two optional inlet walls 320, 330, which are inclined in opposite directions to define an inlet 340 for the respective groove 310. Each groove 310 further comprises a vertical bearing wall 350 that extends downwardly from the inlet wall 320, and a wedging wall 370 that extends downwardly at an incline toward the bearing wall 350. Optionally, each groove may also include an opposite wall 360, which is vertical and which extends downwardly from the inlet wall 330, and a bottom wall 380. The bottom wall 380 extends between the bearing wall 350 and the wedging wall 370 and may be used to define a groove radius (FIG. 1).

Thus, the opposite walls 360 and the bottom walls 380 are not absolutely necessary and may be optionally omitted. If the bottom walls 380 are omitted, the wedging walls 370 meet the bearing walls 350 where the grooves 310 are deepest. As shown, the wedging walls 370 are planar. Alternatively, whether or not the bottom walls 380 are omitted, the wedging walls 370 are curved, e.g. concave. In accordance with the disclosed embodiment of the present invention, a line normal to the wedging wall 370 (whether planar or curved) of a given groove 310 should intersect but not be normal to the bearing wall 350 of the same groove 310. As shown particularly in FIG. 1, each groove 310 follows a circular arc and the groove radius of each groove 310 is greater than the workpiece radius. However, if the workpieces were rectangular, each groove 310 would preferably follow a straight line.

So as to retain the workpieces 10 in the grooves 310, which open upwardly, the bearing walls 350 and the opposite walls 360 should be non-horizontal. As shown, the bearing walls 350 and the opposite walls 360 are vertical, so as to enable the grooved members 100, 200 to work effectively on, for example, the transfer arms of the transfer mechanism, an example of which is described below in connection with FIGS. 11–13. For other applications, the bearing walls 350 and the opposite walls 360 might be differently oriented and use a different biasing mechanism (other than gravity) to drive the workpieces into the respective grooves.

Being parallel to one another and spaced from one another, the grooved members 100, 200 are oriented so that the grooves 310 of the grooved members 100, 200 are generally aligned with one another, i.e., so that each groove 310 of the first grooved member 100 is aligned generally with a corresponding groove 310 of the second grooved member 200 and vice-versa. The grooves 310 of the grooved members 100, 200, should be thus aligned for the grooved members 100, 200, to work effectively on the transfer arms 305 of a transfer mechanism, as mentioned above, and for the grooves 310 of the grooved members 100, 200, to receive the workpieces 10.

When the grooved members 100, 200 are mounted to, for example, the transfer arms 305 described below, they are mounted so that they are oppositely oriented. That is, the first grooved member 100 is oriented so that the front faces 20 of the received workpieces 10 bear against the bearing walls 350 of the grooves 310 of the first grooved member 100 and so that the received workpieces 10 touch the wedging walls 370 of the grooves 310 of the first grooved member 100. The second grooved member 200 is oriented so that the back faces 30 of the received workpieces 10 bear against the bearing walls 350 of the grooves 310 of the second grooved member 200 and so that the received workpieces 10 touch the wedging walls 370 of the grooves 310 of the second grooved member 200. Thus, being biased, for example, by gravity into the grooves 310, the received workpieces 10 are wedged into the grooves 310 so as not to tip, shake, or wobble.

If the grooves 310 of the grooved members 100, 200, are precisely aligned, i.e. so that the bearing walls 350 of the grooved member 100 are generally coplanar with the opposite walls 360 of the grooved member 200 and so that the bearing walls 350 of the grooved member 200 are generally coplanar with the opposite walls 360 of the grooved member 100, the received workpieces 10 are not coaxial but are turned slightly on vertical axes through their centers. Depending upon the presence of and structure of the bevels 50, 60, the received workpieces 10 touch the wedging walls 370 at the outer edges 54, 64, or at the inner edges 52, 62.

Figure 8:
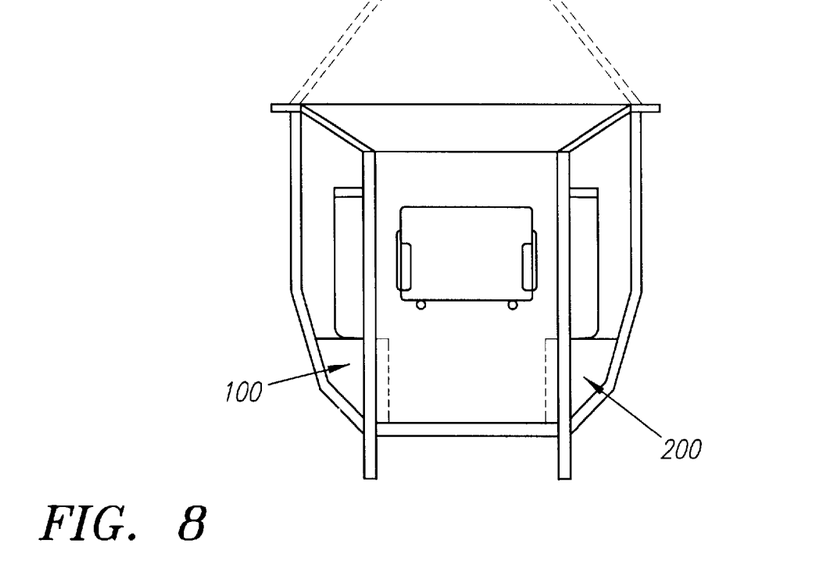
FIG. 8 illustrates use of the grooved support configuration in a workpiece cassette.

It will be readily recognized that the foregoing grooved configuration may be employed in any number of situations requiring support of one or more microelectronic workpieces. For example, as illustrated in block diagram form in FIG. 8, the grooved members 100 and 200 may be disposed in a workpiece cassette or the like. The grooved members 100 and 200 may be formed as separate pieces or, alternatively, formed as a single piece with other portions of the cassette.

Figure 9:
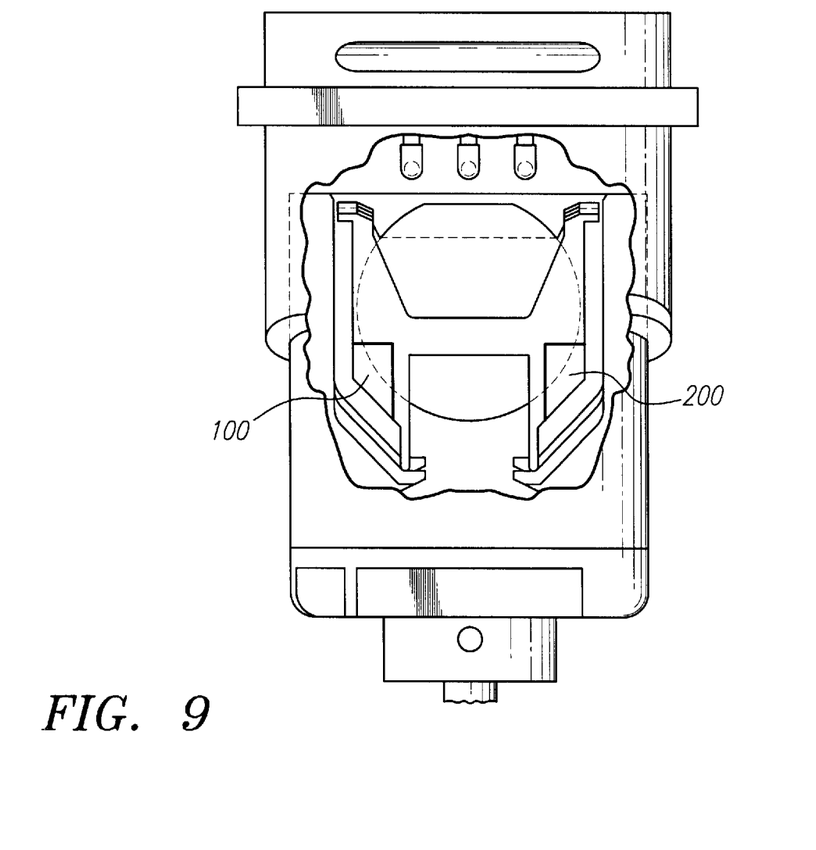
FIG. 9 illustrates use of the grooved support configuration in a wet-bench processing apparatus.

As illustrated in FIG. 9, the grooved configuration may also be employed in place of traditional supports used in wet-bench processing. For example, the grooved configuration exemplified by members 100, 200 may be used on an elevator assembly that introduces one or more microelectronic workpieces to a processing station. One such apparatus is disclosed in U.S. Pat. No. 5,868,150, which is hereby incorporated by reference. Other potential uses include, for example, support for one or more workpieces in a thermal reactor, support for one or more workpieces at a staging area within a processing tool, etc.

A preferred material for the grooved members 100, 200, is poly(ethylene terephthalate)-para (which is abbreviated as p-PET or as PET-p) of Durometer Shore D 87, as available commercially from DSM Engineering Plastic Products of Reading, Pa., under the trademark ERTALYTE. Materials that can be alternatively used for the grooved members 100, 200, include other engineering polymers, various metals, and quartz. The particular material that is used should be chosen so that it is compatible with the processing fluids, if any, to which the grooved members are exposed.

Figure 10:
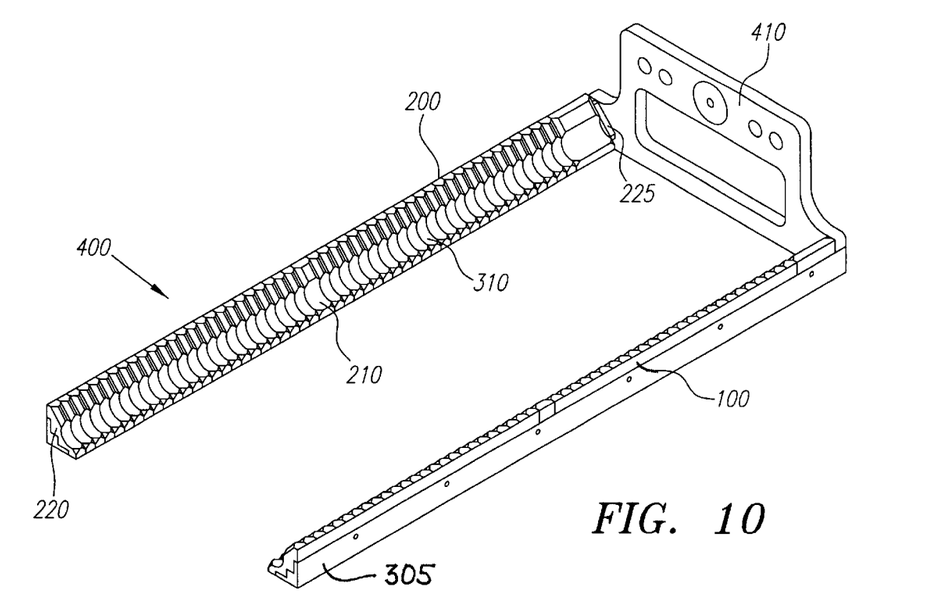
FIG. 10 illustrates a perspective view of an end effector including the grooved support configuration.

FIG. 10 illustrates grooved members 100, 200 formed as part of an end effector 400. In addition to the grooved members 100, 200, the end effector 400 includes a cross member 410 connected to one of the ends of each of the grooved members 100, 200. The cross member 410 helps to maintain proper spacing and orientation between the two grooved members 100, 200. The cross member 410 further facilitates a point at which the end effector 400 may be mounted or attached to another assembly, like a robot arm.

In a preferred embodiment, the end effector 400 further includes a pair of sensor elements, a sensor projector 220 and a sensor detector 225, at opposing ends of grooved member 200. The sensor elements are aligned so as to project or detect a signal transmitted along the recess 210 of the grooved member 200. The sensor projector 220 and the sensor detector 225 facilitate the detection of the presence of one or more workpieces positioned in corresponding grooves 310 of the end effector 400.

Figure 11:
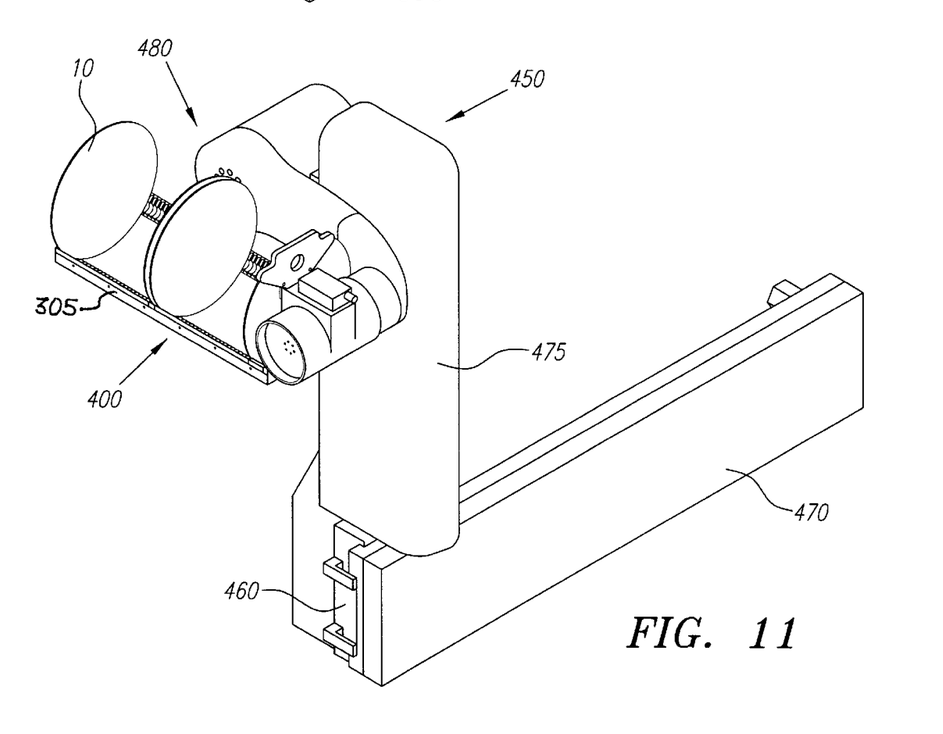
FIG. 11 illustrates a perspective view of the end effector mounted to a robotic arm.
Figure 12:
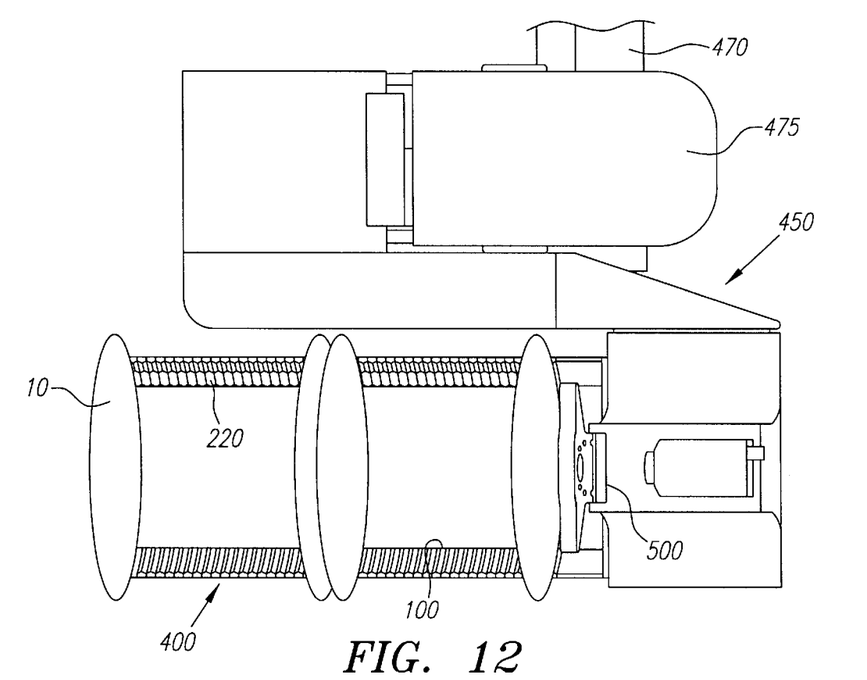
FIG. 12 illustrates a top perspective view of the end effector mounted to a robotic arm.
Figure 13:
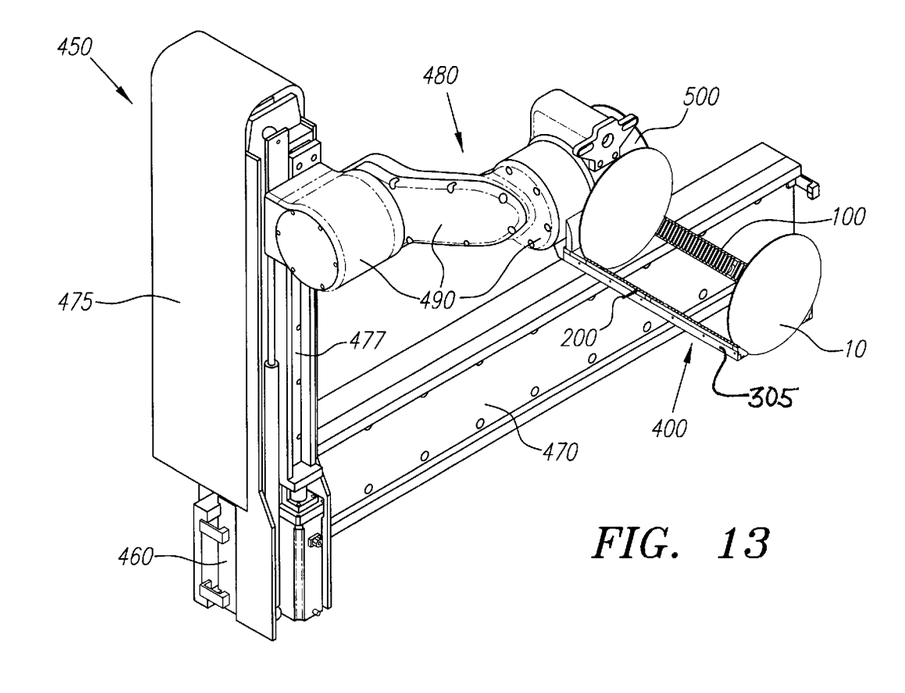
FIG. 13 illustrates a perspective view of the end effector mounted to a robotic arm with the robotic arm extended.

FIGS. 11–13 illustrate several perspective views of the end effector 400 mounted to a robotic arm 450. In a preferred embodiment the robotic arm 450 is a robotic wafer delivery arm for use in a semiconductor processing system, similar to the processing system described in the previously identified patent to Thompson et al., U.S. Pat. No. 5,660,517.

The robotic arm 450 includes a carriage or tram 460, which is coupled to and rides along a conveyor 470. The robotic arm 450 additionally includes a base portion 475 having a vertical track 477 upon which an upper arm portion 480 travels. The upper arm portion 480 includes multiple segments 490, which rotate with respect to one another so as to extend or retract the end 500 of the upper arm portion 480. In connection therewith an end effector 400 mounted to the end 500 of the robotic arm 450 can be similarly extended or retracted.

In a preferred embodiment, the extending and retracting of the end 500 of the robotic arm 450 is used for loading and unloading workpieces 10 to and from one or more workpiece processing stations, not shown. Using an end effector 400 having grooved members 100, 200, as provided by the present invention, mounted to the end 500 of the robotic arm 450 to load and unload workpieces, helps limit the shaking and/or wobbling of the workpieces as the workpieces are transferred between workpiece processing stations.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. A workpiece support for receiving a series of workpieces, each workpiece having a front face, a back face, and an outer perimeter, the workpiece support comprising:
   a set of grooved members, each grooved member including a series of grooves interspersed between a series of teeth, each groove including a bearing wall and a wedging wall for receiving a workpiece therebetween;
   wherein in at least a first grooved member of the set of grooved members, the bearing walls are oriented so as to face toward and bear against the front faces of the received workpieces, and the wedging walls are angled so as to face toward the back faces of the received workpieces;
   wherein at least a second grooved member of the set of grooved members, the bearing walls are oriented so as to face toward and bear against the back faces of the received workpieces, and the wedging walls are angled so as to face toward the front faces of the received workpieces received workpieces; and
   wherein the teeth of at least one of the grooved members include an aligned recess to accommodate a workpiece sensor.

2. The workpiece support of claim 1 wherein the bearing wall is generally parallel to the face of the received workpiece opposite the bearing wall.

3. The workpiece support of claim 1 wherein the wedging wall is at an angle between perpendicular and parallel with respect to the bearing wall and the face of the received workpiece opposite the wedging wall.

4. The workpiece support of claim 3 wherein the wedging wall engages an edge of the received workpiece.

5. The workpiece support of claim 3 wherein the wedging wall engages at least a portion of a beveled edge of the received workpiece.

6. The workpiece support of claim 1 wherein each groove further includes a bottom wall extending between the bearing wall and the wedging wall.

7. The workpiece support of claim 1 wherein each groove further includes an opposite wall extending up from the wedging wall and being generally parallel to the bearing wall.

8. The workpiece support of claim 7 wherein each groove further includes a pair of inlet walls each being associated with one of the bearing wall and the opposite wall, wherein the inlet walls are each at an angle between perpendicular and parallel with respect to the associated bearing wall and opposite wall, and generally faces upward so as to provide a groove that is wider at the opening.

9. The workpiece support of claim 1 wherein the series of grooves of the first grooved member are generally aligned, so as to correspond to the series of grooves of the second grooved member.

10. The workpiece support of claim 1 wherein the first grooved member is generally parallel to the second grooved member.

11. The workpiece support of claim 1 wherein the first grooved member is spaced apart from the second grooved member.

12. The workpiece support of claim 1 wherein the first grooved member is generally parallel to and spaced apart from the second grooved member, and wherein the workpiece support includes a cross member connected between respective ends of each of the first and second grooved members.

13. The workpiece support of claim 1 wherein the first grooved member and the second grooved member are formed as a single piece.

14. The workpiece support of claim 1 further comprising an engagement member having a pair of transfer arms cantilevered off of a cross member, the elongated supports forming a mating arrangement to support the set of grooved members.

15. The workpiece support of claim 1 wherein the workpiece sensor includes a sensor projector and a sensor detector at opposing ends of the at least one grooved member having the aligned recess.

16. A workpiece support for receiving a workpiece having a front face, a back face, and an outer perimeter, the workpiece support comprising:
an end effector including a cross member having a pair of elongated supports cantilevered off of the cross member for supporting a first grooved member and a second grooved member;
the first grooved member including a series of grooves interspersed between a series of teeth having a bearing wall and a wedging wall for receiving a workpiece therebetween, the bearing wall of the first grooved member being oriented so as to face toward and bear against the front face of the received workpieces, and the wedging wall being angled so as to face toward the back face of the received workpiece;
the second grooved member aligned with the first grooved member, the second grooved member including a series of grooves interspersed between a series of teeth, the second grooved member having a bearing wall and a wedging wall for receiving a workpiece therebetween, the bearing wall of the second grooved member being oriented so as to face toward and bear against the back face of the received workpiece, and the wedging wall being angled so as to face toward the front face of the received workpiece; and
wherein the teeth of at least one of the first grooved member or the second grooved member include an aligned recess to accommodate a workpiece sensor.

17. The workpiece support of claim 16 wherein the bearing wall of each of the first and second grooved members is generally parallel to the face of the received workpiece opposite the bearing wall.

18. The workpiece support of claim 16 wherein the wedging wall of each of the first and second grooved members is at an angle between perpendicular and parallel with respect to the bearing wall the face of the received workpiece opposite the wedging wall.

19. The workpiece support of claim 18 wherein the wedging wall of each of the first and second grooved members engages an edge of the received workpiece.

20. The workpiece support of claim 18 wherein the wedging wall of each of the first and second grooved members engages at least a portion of a beveled edge of the received workpiece.

21. The workpiece support of claim 16 wherein each groove of the first and second grooved members further includes a bottom wall extending between the bearing wall and the wedging wall.

22. The workpiece support of claim 16 wherein each groove of the first and second grooved member further includes an opposite wall extending up from the wedging wall and being generally parallel to the bearing wall.

23. The workpiece support of claim 22 wherein each groove of the first and second grooved members further includes a pair of inlet walls each being associated with one of the bearing wall and the opposite wall, wherein the inlet walls are each at an angle between perpendicular and parallel with respect to the associated bearing wall and opposite wall, and generally face upward so as to provide a groove that is wider at the opening thereof.

24. The workpiece support of claim 16 wherein the first grooved member is generally parallel to the second grooved member.

25. The workpiece support of claim 16 wherein the first grooved member is spaced apart from the second grooved member.

26. The workpiece support of claim 16 wherein the first grooved member is generally parallel to and spaced apart from the second grooved member, and wherein the workpiece support includes a cross member connected between respective ends of each of the first and second grooved members.

27. The workpiece support of claim 16 wherein the first grooved member and the second grooved member are formed as a single piece.

28. A robotic transfer mechanism for manipulating microelectronic workpieces, the microelectronic workpieces having a front face, a back face, and an outer perimeter, the robotic transfer mechanism comprising:
a base including a track;
an arm assembly vertically moveable along the track and including an arm segment offset to one side of the base, with the arm segment having a first end and a second end, the first end pivotably supported on the track such that the arm segment is pivotable in the vertical direction and, an end effector pivotably supported on the second end of the arm segment, the arm assembly including drive motors for pivoting the arm segment relative to the base and for pivoting the end effector relative to the arm segment, the end effector comprising:
a first grooved member including at least one groove having a bearing wall and a wedging wall for receiving a workpiece therebetween, the bearing wall of the first grooved member being oriented so as to face toward and bear against the front face of the received workpieces;

a second grooved member extending in a direction parallel to the first grooved member, the second grooved member including at least one groove aligned with the at least one groove of the first grooved member, the at least one groove having a bearing wall and a wedging wall for receiving a workpiece therebetween, the bearing wall of the second grooved member being oriented so as to face toward and bear against the back face of the received workpiece, and the wedging wall being angled so as to face toward the front face of the received workpiece; and wherein each of the teeth of at least one of the grooved members includes an aligned recess to accommodate a workpiece sensor.

29. The robot transfer mechanism according to claim 28, wherein the first grooved member and the second grooved member and cross member are formed as a single piece.

30. The robot transfer mechanism according to claim wherein the workpiece sensor includes a sensor projector and a sensor detector at opposing ends of at least one of the grooved members.

31. An apparatus for processing microelectronic workpieces in which the microelectronic workplaces have a front face, a back face, and an outer perimeter, the apparatus comprising:

a microelectronic workpiece processing station;

a robotic transfer mechanism disposed to transport microelectronic workpieces to and from the microelectronic workpiece processing station, the robotic transfer mechanism including, an upright base;

an arm assembly movable vertically on the base and including an arm segment having a first end and a second end with the first end pivotably supported on the base such that the arm segment is pivotable in the vertical direction;

a workpiece support pivotably supported on the second end of the arm segment and comprising:

a first grooved member having a first end attached to a cross member so that the first grooved member is cantilevered off of the cross member, and with the first grooved member including at least one groove having a bearing wall and a wedging wall for receiving a workpiece therebetween, the bearing wall of the first grooved member being oriented so as to face toward and bear against the front face of the received workpiece, and the wedging wall being angled so as to face toward the back face of the received workpiece;

a second grooved member having a first end attached to the cross member so that the second grooved member is cantilevered off of the cross member and extending in a direction parallel to the first grooved member, the second grooved member including at least one groove aligned with the at least one groove of the first grooved member, the at least one groove having a bearing wall and a wedging wall for receiving a workpiece therebetween, the bearing wall of the second grooved member being oriented so as to face toward and bear against the back face of the received workpiece, and the wedging wall being angled so as to face toward the front face of the received workpiece;

wherein in the retracted position, the workpiece support is disposed on a side of the vertical base and at least one of the grooved members includes an aligned recess to accommodate a workpiece sensor.

32. The apparatus according to claim 31, wherein the first grooved member and the second grooved member and cross member are formed as a single piece.

33. The apparatus according to claims 31, wherein the workpiece sensor includes a sensor projector and a sensor detector at opposing ends of at least one of the grooved members.

34. The apparatus according to claim 31, the arm assembly of the robotic transfer mechanism including drive motors for pivoting the arm segment relative to the base and for pivoting the workpiece support relative to the arm segment.

35. A workpiece support for receiving a series of workpieces, each workpiece having a front face, a back face, and an outer perimeter, the workpiece support comprising:

a set of grooved members, each grooved member including a series of grooves interspersed between a series of teeth, each groove including a bearing wall and a wedging wall for receiving a workpiece therebetween;

wherein in at least a first grooved member of the set of grooved members, the bearing walls are oriented so as to face toward and bear against the front faces of the received workpieces, and the wedging walls are angled so as to face toward the back faces of the received workpieces;

wherein at least a second grooved member of the set of grooved members, the bearing walls are oriented so as to face toward and bear against the back faces of the received workpieces, and the wedging walls are angled so as to face toward the front faces of the received workpieces; and wherein the teeth of at least one of the grooved members include an aligned recess to accommodate a workpiece sensor and wherein the workpiece sensor includes a sensor projector and a sensor detector at opposing ends of the grooved member.

* * * * *